United States Patent [19]
Watanabe et al.

[11] Patent Number: 5,464,714
[45] Date of Patent: Nov. 7, 1995

[54] PROCESS FOR PRODUCING COLOR FILTER PLATE AND COLOR FILTER PLATE THUS PRODUCED

[75] Inventors: Yasuyuki Watanabe, Chigasaki; Kazuya Ishiwata, Yokosuka; Naoya Nishida, Hadano, all of Japan

[73] Assignee: Canon Kabushiki Kaisha, Tokyo, Japan

[21] Appl. No.: 206,937

[22] Filed: Mar. 7, 1994

[30] Foreign Application Priority Data

Mar. 5, 1993 [JP] Japan .................................... 5-069114
Mar. 5, 1993 [JP] Japan .................................... 5-069115

[51] Int. Cl.⁶ ..................................................... G03F 9/00
[52] U.S. Cl. ........................... 430/7; 430/27; 430/326; 430/329
[58] Field of Search ................................ 430/7, 27, 326, 430/329

[56] References Cited

U.S. PATENT DOCUMENTS 4,370,396  1/1983  Sato et al. ..................................... 430/7

FOREIGN PATENT DOCUMENTS 53-653      1/1978  Japan .
63-38689    8/1988  Japan .
21311       1/1990  Japan .

Primary Examiner—S. Rosasco
Attorney, Agent, or Firm—Fitzpatrick, Cella, Harper & Scinto

[57] ABSTRACT

A color filter plate suitable for inclusion in a color liquid crystal display panel is produced through a process including the steps of (a) forming a color filter pattern on a transparent substrate, (b) forming a light-interrupting mask layer over the color filter pattern, (c) abrading the mask layer with an abrasive to expose the color filter pattern and leave a patterned mask layer contiguous with the color filter pattern, and (d) coating the color filter pattern and the patterned mask layer with a protective layer. As a result, it becomes possible to omit a step of patterning the mask layer and an exposure mask for the patterning, so that the process is simplified, the production cost is lowered and the latitude of the mask-forming material is increased.

10 Claims, 4 Drawing Sheets

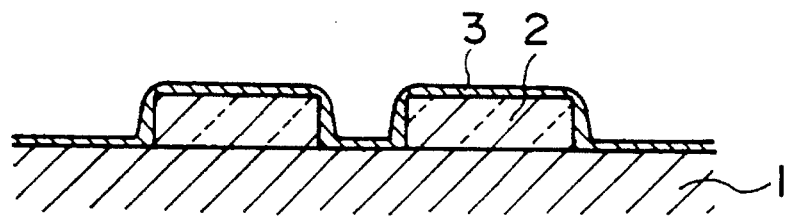
F I G. 1A
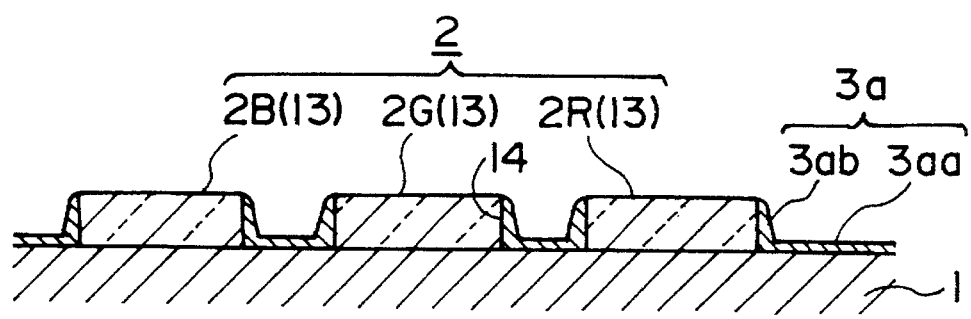
F I G. 1B
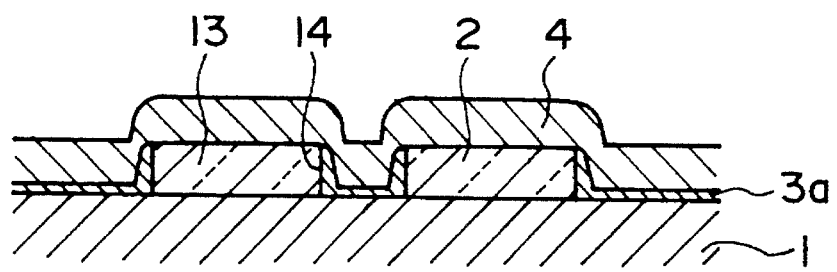
F I G. 1C

PROCESS FOR PRODUCING COLOR FILTER PLATE AND COLOR FILTER PLATE THUS PRODUCED

FIELD OF THE INVENTION AND RELATED ART

The present invention relates to a color filter plate and a process for producing the color filter plate characterized by making unnecessary a step of patterning a light-interrupting masking layer and an exposure mask for the patterning.

In recent years, it has been a general practice to dispose a light-interrupting mask between pixels in order to accomplish a higher resolution or definition and an improved display quality of a liquid crystal panel. For example, Japanese Patent Publication (JP-B) 63-38689 has proposed to dispose metal electrodes as wiring or signal-supplying electrodes in the form of ladders on transparent electrodes for display on one substrate so as to mask a spacing between pixels on the counter-substrate. With respect to color filter plates (i.e., substrates provided with a color filter), JF-B 53-653 has proposed to dispose color filters between light-interrupting layers and JP-B 2-1311 has proposed to dispose a lamination of an opaque film and a transparent film at boundaries between color filters.

A light-interrupting metal mask as described above may be coated with an insulating layer, which may for example comprise an inorganic material inclusive of oxides, such as $SiO_2$, $Ta_2O_5$, $Al_2O_3$ and those formed by oxidation of organometallic compounds, and an organic material such as polyimide and polyamide.

The color filters formed on such a light-interrupting metal mask may also be regarded as a kind of insulating film. A color filter may comprise a cured photosensitive resin layer colored by dispersing therein a colorant, and colored resin patterns of plural colors may be used to constitute a color filter. In a certain color filter, the colorant may be dispersed in an increasing amount from a lower part to an upper part within a colored resin layer.

However, the above-proposed metal electrodes in the form of ladders as a light-interrupting mask between pixels are liable to cause an alignment disorder at parts surrounded by the metal electrodes, e.g., when used in combination with a ferroelectric liquid crystal.

In order to obviate the above difficulty, there has been proposed a structure of a liquid crystal device as shown in FIG. 5 wherein light-interrupting masks 3a are directly formed on a transparent substrate 1 of, e.g., glass and then covered with insulating layers as described above. For the purpose of light interruption, the masks are disposed to cover the regions except for the effective display region. Incidentally, the liquid crystal device shown in FIG. 5 further includes color filters 2, a protective layer 4, transparent electrodes 7, metal electrodes 8 for wiring or enhanced conductivity, insulating layers 9, alignment films 10, cell gab spacers 11 and a liquid crystal 12.

The mask 3a may be composed of a metal or a resin containing a colorant dispersed therein. In order to provide an optical density of at least 2 (transmittance of at most 1%), preferably at least 3, a thickness of at least about 800 Å is required for a metal deposition film of, e.g., Cr, Mo or Al, or a thickness of at least about 1.5–2.0 μm similarly as that of a color filter is popular for a carbon-dispersed resin film.

However, in the case of a conventional color filter plate comprising a metal masking film, there are encountered difficulties in film formation for a large sized liquid crystal panel, adhesion with color filter patterns and resistance to heat and chemicals. Even in case of, e.g., a Cr film having relatively good properties, there have still been problems, such as difficulties in fine patterning by etching and in disposing of the waste liquid.

Further, in the case of the masking film comprising a resin containing a colorant dispersed therein, the required thickness thereof becomes as large as that of a color filter, and the color filter pattern is to be formed on the masking layer, so that it is difficult to flatten the color filter pattern.

SUMMARY OF THE INVENTION

An object of the present invention is to solve the above-mentioned problems of the prior art.

A more specific object of the present invention is to provide a process for producing a color filter plate capable of simplifying the production steps and therefore reducing the production cost and further capable of increasing the latitude of material selection for a light-interrupting mask layer.

Another object of the present invention is to provide a process for producing a color filter plate including an abrasion step wherein the commingling of abrasive particle residue or foreign matter is obviated to prevent the occurrence of damage caused thereby.

A further object of the present invention is to provide a color filter plate characterized by a unique shape obtained through a process as described above.

According to the present invention, there is provided a process for producing a color filter plate, comprising the steps of:

(a) forming a color filter pattern on a transparent substrate, (b) forming a light-interrupting mask layer over the color filter pattern, (c) abrading the mask layer with an abrasive means to expose the color filter pattern and leave a patterned mask layer contiguous with the color filter pattern, and (d) coating the color filter pattern and the patterned mask layer with a protective layer.

According to another aspect of the present invention, there is provided a process for producing a color filter plate comprising a transparent substrate, and a color filter pattern and a patterned mask layer formed contiguous with each other on the transparent substrate comprising a step of abrading the color filter pattern and the patterned mask layer with an abrasive means while always using a fresh surface of the abrasive means.

According to a further aspect of the present invention, there is provided a color filter plate, comprising: a transparent substrate: a color filter pattern and a patterned mask layer formed contiguous with each other on the transparent substrate; and a protective layer covering the color filter pattern and the patterned mask layer: the patterned mask layer having a boundary portion contiguous with the color filter pattern, the boundary portion of the patterned mask layer having a top which is flush with the color filter pattern.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIGS. 1A–1C are sectional views in a thickness direction for illustrating steps involved in a process for producing a color filter plate according to the present invention.

DETAILED DESCRIPTION OF THE INVENTION

Figure 2:
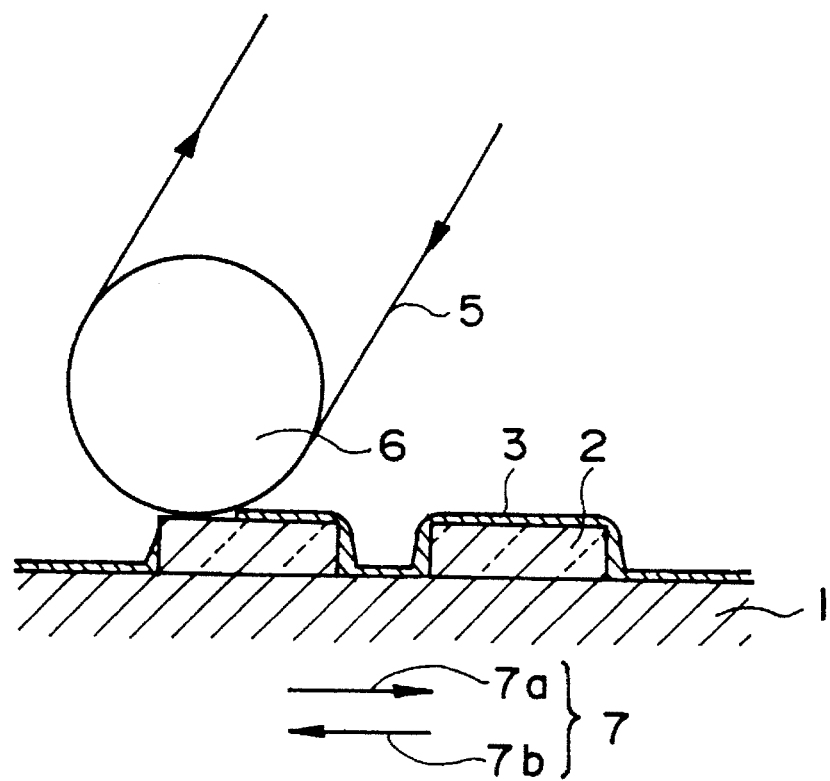
FIG. 2 is a sectional illustration of an abrasion stop using an abrasive means in the abrasion step in an embodiment of the process according to the present invention.

In a first embodiment of the process for producing a color filter plate according to the present invention, the following steps (a)–(d) are included with reference to FIGS. 1A–1C:

(a) forming a color filter pattern 2 on a transparent substrate 1, (b) forming a light-interrupting mask layer 3 over the color filter pattern (FIG. 1A), (c) abrading the mask layer with an abrasive means to expose the color filter pattern 2 and leave a patterned mask layer 3a contiguous with the color filter pattern (FIG. 1B), and (d) coating the color filter pattern and the patterned mask layer 3 with a protective layer 4 (FIG. 1C).

The materials for the transparent substrate 1, the color filter pattern 2, the patterned mask layer (or light-interrupting mask) 3a and the protective layer 4 are similar to those conventionally used. More specifically, the light-interrupting color mask layer 3 (giving the patterned mask layer 3a) may comprise a metal or a resin containing a colorant dispersed therein formed into a film, e.g., by vapor deposition, spin coating or printing, in a thickness sufficient to provide a required optical density. It is particularly preferred to form the mask layer 3 of a metal of aluminum (Al), molybdenum (Mo), tantalum (Ta), or a mixture of these metals, or a laminate of these metal films.

Hereinbelow, the present invention will be described based on specific Examples.

Example 1

A color filter plate having a sectional structure as shown in FIG. 1C was prepared.

The color filter pattern 2 including three color segments of R, G and B comprising patterned resin films (of, e.g., a photosensitive polyamide available from Ube Kosan K.K.) including the respective colorants (e.g., 0.3–0.4 wt. % of a red colorant, 0.5–0.6 wt. % of a green colorant and 0.3 –0.4 wt. % of a blue colorant) dispersed therein was formed successively through lithographic steps on a glass substrate 1. The respective color segments were respectively formed in a thickness of about 1.5 μm with a deviation in height of at most 0.2 μm between colors and with a maximum surface roughness Rmax=0.1 –0.15 μm.

Then, the transparent glass substrate 1 provided with the color filter pattern 2 was coated with a 1000 Å-thick Al layer 3 as a light-interrupting mask layer formed by sputtering (FIG. 1A).

Then, the Al mask layer 3 was abraded with a urethane foam disk rotating and oscillating for 3 minutes in the presences of an abrasive liquid containing 0.3 μm-dia. alumina abrasive particles, As a result, parts of the Al mask layer above the color filter pattern 2 were completely removed to expose the color filter pattern 2 including the respective color segments and leave a patterned mask layer 3a including a portion 3aa between the color segments 2R (G or B) (constituting pixels 13) and an elevated boundary portion 3ab contiguous (i.e., in self-alignment) with (a wall 14 of) the color filter pattern 2 and having a top flush with the surface of the color filter pattern 2 (FIG. 1B).

The color filter pattern 2 showed a better smoothness as represented by a maximum surface roughness Rmax= 0.05–0.10 μm and a slightly reduced maximum deviation in thickness of 0.15 μm.

Then, the color filter pattern 2 and the patterned mask layer 3a were coated with a 1.5 μm-thick protective layer 4 of MoF to complete a color filter plate as shown in FIG. 1C.

Example 2

A color filter plate having a sectional structure as shown in FIG. 1C was prepared in a similar manner as in Example I except that the abrasion step was performed by using a tape abrasion means including an abrasive tape 5 and a pressure roller 6 as illustrated in FIG. 2.

The abrasive tape 5 was a #6000 $Al_2O_3$ abrasive tape. The abrasion was performed by feeding the abrasive tape 5 at a speed of 300 mm/min. in one direction denoted by an arrow and the substrate 1 at a speed of 75 mm in either one of reciprocal directions 7 while rocking the pressure roller 6 reciprocally in its axis directions at a rate of 90 cycles/min. and a stroke of 4 mm and pressing the roller 6 against the mask layer 3 so as to apply a pressure of 5 kg-f/$cm^2$. The abrasion operation was repeated 5 times by reversing the moving direction of the substrate relative to that of the abrasive tape 5 (or the pressure roller 6) each time.

As a result, parts of the Al mask layer 3 above the color filter pattern 2 were completely removed to expose the color filter pattern 2 including the respective color segments surrounded by the remaining self-aligned patterned mask layer 3a, the maximum surface roughness Rmax of the respective color segments was reduced to 0.05–0.10 μm, and the deviation in height between different color segments was reduced to 0.05 μm at the maximum.

The resultant color filter pattern 2 and the patterned mask layer 3a were finally coated with a 1.5 μm-tick protective layer 4 to complete a color filter plate as shown in FIG. 1C.

Example 3

Figure 3:
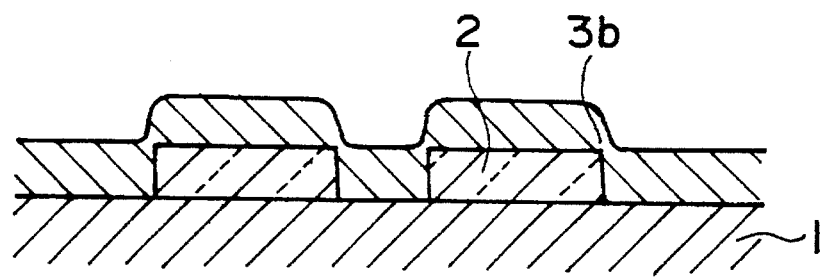
FIG. 3 is a sectional view showing a state before the abrasion step in an embodiment of the present invention.

A color filter pattern 2 having a thickness of 1.5 μm was formed on a glass substrate in the same manner as in Example 1 and thereafter coated with a similarly 1.5 μm-thick resinous mask layer 3b containing carbon fine powder dispersed therein formed by printing to form a coated substrate structure as shown in FIG. 3.

Then, the Al mask layer was subjected to abrasion for 30 sec with a #3000 PVA disk having a flat reference surface under a load of 50 g/$cm^2$ while rotating and oscillating the disk.

As a result, parts of resinous mask layer 3b above the color filter pattern 2 was removed to expose the color filter pattern 2, whereas substantially no improvements were accomplished regarding the surface roughness and difference in height between color segments.

Then, the exposed color filter pattern 2 and the surrounding mask layer were subjected to an additional abrasion which was identical to that applied in Example 2. As a result, the maximum surface roughness of the color filter segments was reduced to 0.05–0.10 µm and the deviation in height between color segments was reduced to 0.05 µm at the maximum.

Example 4

A color filter pattern 2 (including color segments 2R, 2G and 2B) was formed on a glass substrate 1 through lithographic steps in the same manner as in Example 1. The color segments were respectively formed in a thickness of about 1.5 µm with a maximum deviation in height of 0.2 µm between color segments.

Figure 4A:
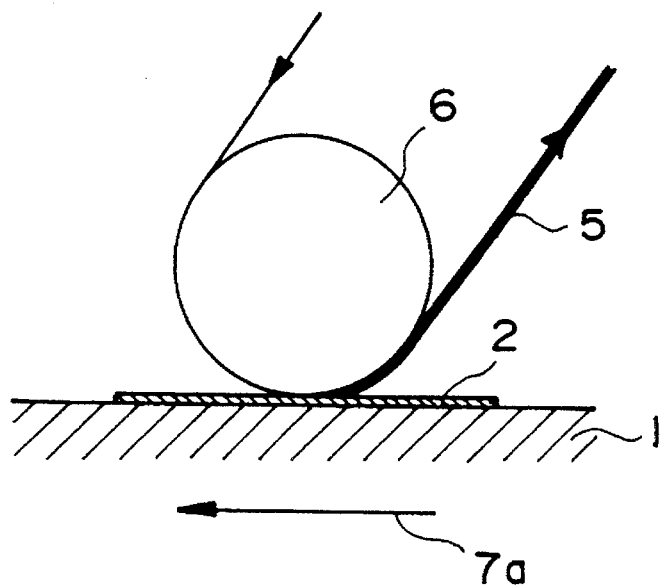
FIGS. 4A and 4B are views for illustrating relative moving directions of a transparent substrate and an abrasive tape in the abrasion step in an embodiment of the color filter plate production process according to the present invention.
Figure 4B:
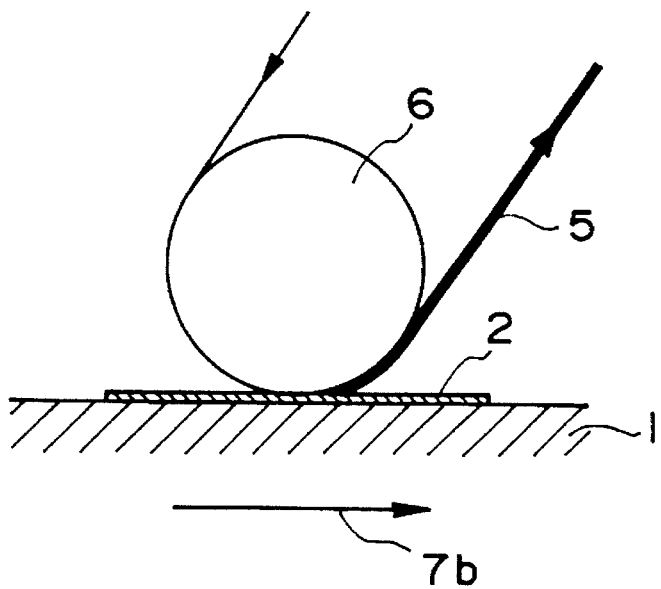
Figure 5:
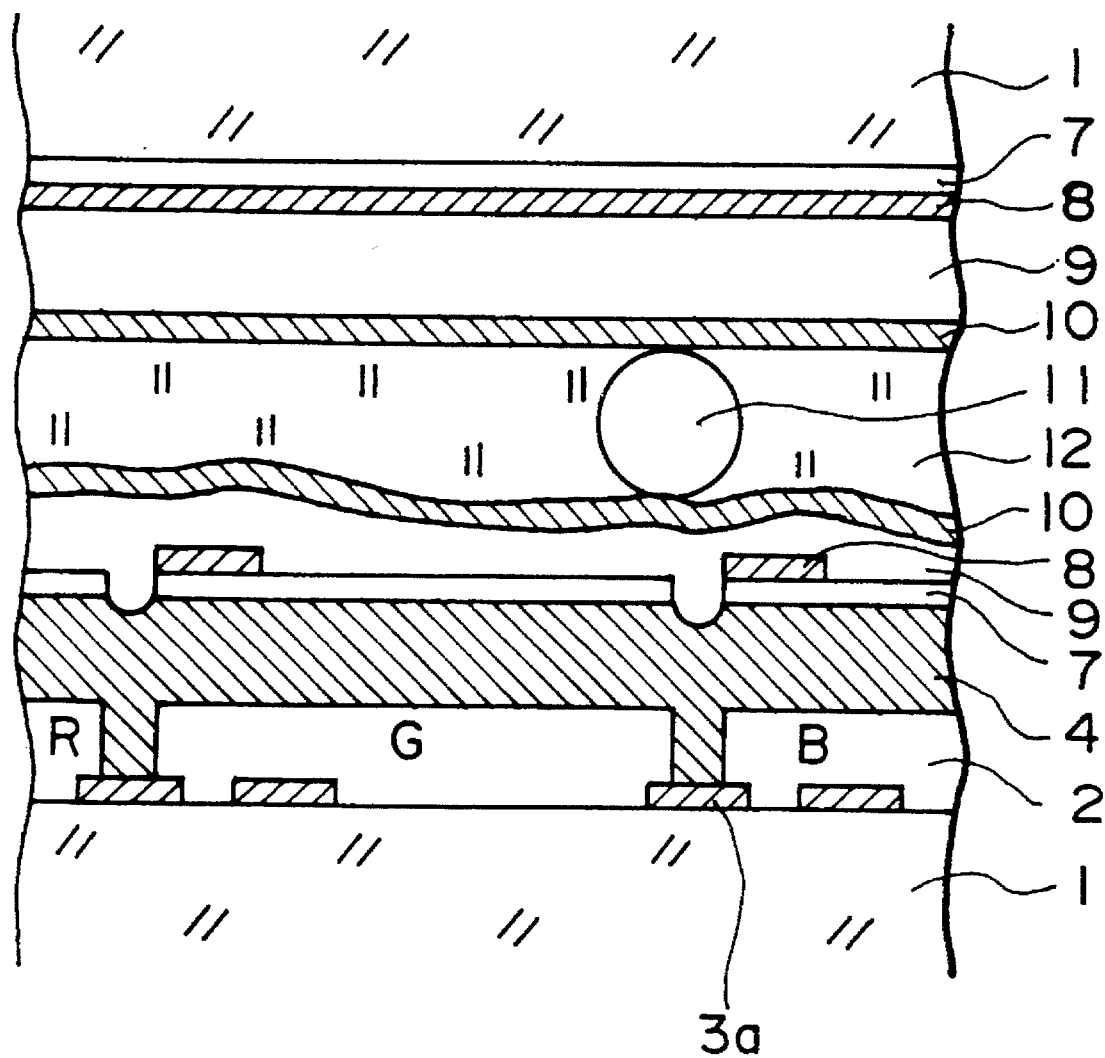
FIG. 5 is a sectional view of a conventional liquid crystal display device including a color filter plate structure.

The color filter pattern was subjected to an abrasion operation as shown in FIGS. 4A and 4B. The abrasive tape 5 was one comprising a 0.2 µm-thick PET (polyethylene terephthalate) film substrate tarrying ROI-based abrasive particles having a grain size of 2 µm and stuck thereto. The abrasion was performed by feeding the abrasive tape 5 at a speed of 300 mm/min. in one direction denoted by an arrow and the substrate 1 at a speed of 75 nm in either one of reciprocal directions 7 (7a as shown in FIG. 4A and 7b as shown in FIG. 4B) while rocking the pressure roller 6 reciprocally in its axis directions at a rate of 90 cycles/min. and a stroke of 4 mm and pressing the roller 6 against the mask layer 3 so as to apply a pressure of 5 kg-f/cm$^2$. The abrasion operation was repeated 5 times by reversing the moving direction (from 7A to 7B or vice versa) of the substrate relative to that of the abrasive tape 5 (or the pressure roller 6) each time.

As a result, almost no deep scars exceeding 0.15 µm were allowed to remain, the maximum surface roughness Rmax of the respective color segments was reduced to 0.05–0.10 µm, and the deviation in height between different color segments was reduced to 0.05 µm at the maximum.

The color filter pattern 2 thus smoothened was then coated with a 1.5 µm-thick passivation layer to form a color filter plate.

The color filter plate was incorporated in a color liquid crystal panel through a prescribed process. The color liquid crystal panel thus prepared was found to show a uniform display characteristic over a wide area.

Example 5

A color filter plate was prepared in a similar manner as in Example 4 except that the abrasion was performed in two steps, i.e., a rough abrasion step principally intended to accelerate the abrasion and a finish abrasion (polishing) step principally intended to repair abrasion scars on the color filter pattern surface.

More specifically, a substrate 1 provided with a color filter pattern 2 as shown in FIGS. 4a and 4B was first subjected to the rough abrasion step wherein the substrate 1 was abraded two times with an abrasive tape having a grain size of 3 µm while moving the substrate 1 in the direction 7a opposite to that of the abrasive tape 5 as shown in FIG. 4A and then to the finish abrasion step wherein the substrate was polished two times with an abrasive tape having a grain size of 1 µm while moving the substrate 1 in the direction 7b identical to that of the abrasive tape 5 as shown in FIG. 4B.

As a result, color filter segments having a smoothness utterly identical to those obtained in Example 4 were obtained in a total of four times of the abrasion operation which was fewer by one time than in Example 4.

The smoothened color filter segments were then coated with a 1.5 µm-thick passivation layer (protective and smoothening layer) to form a color filter plate, which was then incorporated in a color liquid crystal panel. The resultant color liquid crystal panel was found to show a broad drive temperature margin and a uniform display characteristic over a wide area.

Comparative Example 1

A color filter plate was prepared in the same manner as in Example 4 except that, during the abrasion operation, the abrasive tape 5 was fed at a rate of 75 mm/min and the substrate 1 was moved at a rate of 300 mm/min.

The resultant color filter segments were formed to be accompanied with deep scars exceeding 0.15 µm at some parts.

The color segments were coated with a 1.5 µm-thick passivation layer to form a color filter plate, which was then incorporated in a color liquid crystal panel. The color liquid crystal panel was found to involve difficulties, such as breakage of transparent electrodes, short circuit between adjacent electrodes and bit defects due to alignment failure.

What is claimed is:

1. A process for producing a color filter plate, comprising the steps of:

(a) forming a color filter pattern on a transparent substrate, (b) forming a light-interrupting mask layer over the color filter pattern, (c) abrading the mask layer with an abrasive to expose the color filter pattern and leave a patterned mask layer contiguous with the color filter pattern, and (d) coating the color filter pattern and the patterned mask layer with a protective layer.

2. A process according to claim 1, wherein the patterned mask layer is contiguous with a lateral side of the color filter pattern.

3. A process for producing a color filter plate comprising the steps of:

forming a color filter pattern on a transparent substrate;

forming a patterned mask layer over the color filter pattern; and abrading the color filter pattern and the patterned mask layer with an abrasive such that the color filter pattern is contiguous with the patterned mask layer.

4. A process according to claim 1 or 3, wherein the abrasive comprises an abrasive tape continuously or intermittently fed to abrade at least the mask layer.

5. A process according to claim 4, wherein the transparent substrate is fed during the abrading step at a slower speed than the abrasive tape.

6. A process according to claim 4, wherein the abrading step is divided into a rough abrasion step and a subsequent polishing step, and the transparent substrate and the abrasive tape are moved in different relative directions in the rough abrasion step and in the subsequent polishing step.

7. A process according to claim 6, wherein the transparent substrate and the abrasive tape are moved in mutually opposite directions in the rough abrasion step and in identical directions in the subsequent polishing step.

8. A process according to claim 3, wherein a fresh surface of the abrasive is continuously used for abrading the color filter pattern and the patterned mask layer.

9. A process according to claim 3, wherein the patterned mask layer is contiguous with a lateral side of the color filter pattern.

10. A color filter plate, comprising:
   a transparent substrate;
   a color filter pattern formed on said substrate;
   a patterned mask layer contiguous with said color filter pattern; and
   a protective layer covering said color filter pattern and said patterned mask layer, wherein
   said patterned mask layer has a boundary portion contiguous with said color filter pattern, said boundary portion of said patterned mask layer having a top which is flush with said color filter pattern.

* * * * *

UNITED STATES PATENT AND TRADEMARK OFFICE
CERTIFICATE OF CORRECTION

PATENT NO. : 5,464,714
DATED : November 7, 1995
INVENTOR(S) : Watanabe et al.

It is certified that error appears in the above-indentified patent and that said Letters Patent is hereby corrected as shown below:

Title page, item [56], References Cited:

FOREIGN PATENT DOCUMENTS, "21311 1/1990 Japan" should read --2-1311 1/1990 Japan--.

COLUMN 3:

Line 67, "particles," should read --particles.--.

COLUMN 4:

Line 1, "layer" should read --layer 3--.

COLUMN 5:

Line 18, "tarrying" should read --carrying--.
Line 22, "75 nm" should read --75 mm--.

Signed and Sealed this

Second Day of April, 1996

*Attest:*

BRUCE LEHMAN

*Attesting Officer*     *Commissioner of Patents and Trademarks*